SEMI-CONDUCTOR SQUELCH CIRCUIT

Filed Dec. 28, 1953 3 Sheets-Sheet 1

INVENTOR.
LARRY A. FREEDMAN

BY H. L. Newton
ATTORNEY

Oct. 8, 1957 L. A. FREEDMAN 2,809,240

SEMI-CONDUCTOR SQUELCH CIRCUIT

Filed Dec. 28, 1953 3 Sheets-Sheet 2

INVENTOR.

LARRY A. FREEDMAN

BY H. L. Newton

ATTORNEY

Oct. 8, 1957 L. A. FREEDMAN 2,809,240

SEMI-CONDUCTOR SQUELCH CIRCUIT

Filed Dec. 28, 1953 3 Sheets-Sheet 3

INVENTOR.
LARRY A. FREEDMAN

BY H. L. Newton

ATTORNEY

United States Patent Office 2,809,240

Patented Oct. 8, 1957

2,809,240

SEMI-CONDUCTOR SQUELCH CIRCUIT

Larry A. Freedman, New Brunswick, N. J., assignor to Radio Corporation of America, a corporation of Delaware Application December 28, 1953, Serial No. 400,637

7 Claims. (Cl. 179—171)

This invention relates to noise suppression or squelch circuits for radio signal receivers and the like, and in particular to circuits of the type referred to for signal receivers utilizing semi-conductor devices as signal translating and amplifying elements.

Radio signal receivers employing electron discharge devices in the signal translating and amplifying portions thereof have often times been provided, in the past, with squelch and noise suppression circuits for combating undesired noise in the reception of signal energy. The purpose of these circuits is, in general, to squelch or quiet the receiver when sufficient signal energy for satisfactory reception is not present. Where the transmission of signal energy is not continuous but the radio receiver must always be ready to receive a signal, as for example, in police service, a squelch circuit performs the important function of removing the large amount of noise that otherwise might be present in the intervals between the reception of signal energy. In other radio receivers, such as those employed in homes or automobiles, in which tuning through a relatively wide band of frequencies is desired, a squelch circuit will aid in the suppression of interstation noise. A number of different circuit arrangements have been employed in the past in radio receivers utilizing electron discharge devices to suppress noise. Generally, these circuits employ extra circuit elements to render the audio frequency amplifier tube of the receiver non-conductive until a signal is received having a magnitude which exceeds a predetermined threshold level.

Recently, semi-conductor devices such as transistors, which employ a semi-conductive element and at least three contacting electrodes have been the subject of extensive investigation for use in signal receivers as well as other types of signal conveying equipment. Transistors, as is well known, may be used as signal amplifiers and have the advantages of small size, durability, low power requirements and a long useful life. While the benefits of squelch circuits as outlined above recommend their use in signal receivers employing transistors, the characteristics of transistors, which differ from those of electron discharge devices, have made it necessary to find new means for accomplishing the same beneficial result.

It is, accordingly, an object of the present invention to provide a squelch circuit for radio signal receivers and the like employing semi-conductor devices to prevent translation and reproduction of noise when no signal or a weak signal is present.

It is another object of the present invention to provide a squelch circuit for a transistorized signal receiver which functions automatically to render the receiver operative when a received carrier wave attains a predetermined amplitude level.

It is a further object of the present invention to provide, in a signal receiver employing semi-conductor devices, simple yet reliable noise suppression means wherein no extra circuit elements are necessary.

These and further objects and advantages of the present invention are achieved in general by adjusting the resistance of the collector circuit of a semi-conductor amplifier device in such a manner that the collector to base voltage is low and substantially equal to zero for static operating conditions. Accordingly, the reproduction of undesired noise is prevented. The semi-conductor device, which is biased in the forward direction between the emitter and base, is also used as the automatic gain control controlled stage of a radio receiver, and the application of an automatic gain control potential or current to one of the input electrodes of the device reducing the forward bias will initially increase rather than decrease the gain of the amplifier. This action continues until normal amplifier and AGC operation will be restored when sufficient AGC signal is developed to produce normal amplifier potentials on the electrodes. Accordingly, the reproduction of undesired noise is prevented until the received carrier wave signal attains a predetermined amplitude.

The novel features that are considered characteristic of this invention are set forth with particularity in the appended claims. The invention itself, however, both as to its organization and method of operation, as well as additional objects and advantages thereof, will best be understood from the following description when read in connection with the acompanying drawing, in which:

Figure 1:
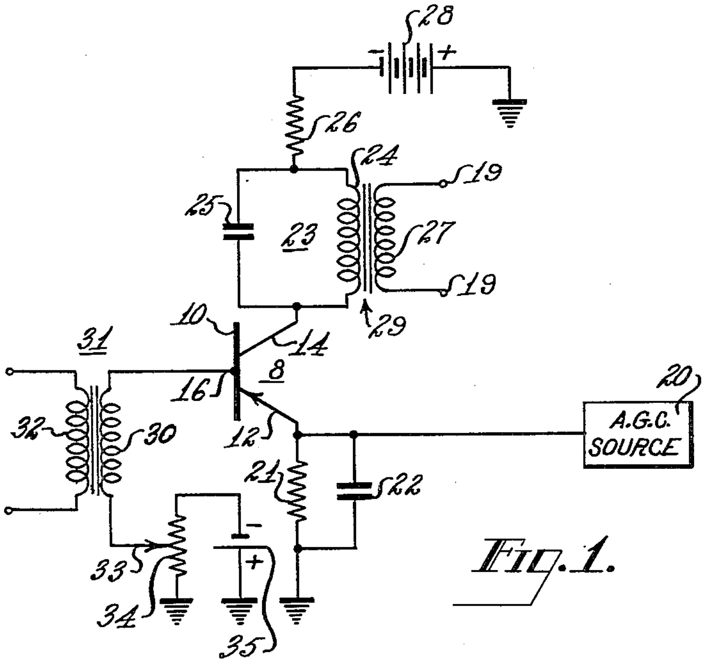
Figure 1 is a schematic circuit diagram of a transistor amplifier and AGC source for a radio signal receiver embodying the present invention.

Referring now to the drawings, wherein like elements are designated by like reference numerals throughout the figures, and referring particularly to Figure 1, a transistor 8 comprises a semi-conductive body 10 having three contacting electrodes which are designated as an emitter 12, a collector 14 and a base 16. The transistor 8 is illustrated as being, by way of example, of the P-N-P junction type, although it should be understood that throughout the description, the use of P-N-P junction transistors is merely for the purpose of illustration and any suitable type having characteristics necessary for proper operation of the circuits may be used.

To properly bias transistor 8 for amplifying action, a battery 28 is provided which has its positive terminal grounded and its negative terminal connected through a resistor 26 to the low signal voltage end of a parallel resonant tuned circuit 23 comprising a primary winding 24 of an interstage coupling transformer 29 and a capacitor 25. Transformer 29 also includes a secondary winding 27 having a pair of output terminals 19. The tuned transformer as described thus provides frequency selectivity as well as proper impedance matching between the transistor amplifier 8 and a succeeding stage. The high signal voltage end of parallel resonant circuit 23 is connected with the collector 14 of transistor amplifier 8.

Further biasing means for the transistor 8 includes a battery 35 having a voltage rating somewhat smaller than that of battery 28, the positive terminal of which is grounded and the negative terminal of which is connected through a tap 33 of a voltage dividing potentiometer 34 and the secondary winding 30 of an input transformer 31 to the base 16 of transistor 8. The emitter 12 is connected to a source of fixed reference potential or ground for the system through a resistor 21 which is by-passed by a capacitor 22. Automatic gain control (AGC) is obtained, in general, by varying the emitter current of transistor 8. To this end, a direct current AGC source 20 is connected directly to the emitter 12 of transistor amplifier 8.

In the presence of a signal having a sufficiently high amplitude, AGC control is effected by increasing the current supplied by the AGC source 20 as the incoming signal is increased. This will be referred to as normal operation of the circuit. Any such increase in the AGC current, as applied to the emitter 12 of transistor 8 will cause the emitter current of transistor 8 to decrease by an amount substantially equal to the amount the AGC current is increased. A decrease in emitter current will cause a decrease in the gain of the transistor which has the effect of maintaining the amplitude of the output signal developed at terminals 19 substantially constant.

Noise squelching is accomplished, in accordance with the present invention, by proportioning the resistance of collector resistor 26 relative to the resistance of the emitter biasing resistor 21 in such a manner that the static collector voltage of transistor 8 is relatively low. Depending on the exact value of the signal threshold desired, the collector resistor will be chosen so as to obtain substantially no potential difference between the collector 14 and base 16 of transistor 8 for static operating conditions. With extremely sensitive receivers and a high signal threshold, a small reverse collector voltage may be desired. By reducing the collector voltage of transistor 8 to this extremely low value, the gain of transistor 8 will also be reduced as is well known and understood. By setting the collector voltage at a low value and consequently reducing the gain of transistor 8, the output signal will be substantially equal to zero when no signal is received or when the received signal is too weak for satisfactory reproduction, and, although a small portion of the signal is translated through the transistor 8 by way of base to collector junction, the reproduction of noise is effectively prevented.

When the received signal attains a predetermined threshold value corresponding to any desired signal-to-noise ratio of output, however, the transistor amplifier 8 will translate unamplified a large enough portion of the signal to cause the AGC source 20 to conduct current. This current will flow through the resistor 21, decreasing the emitter current of transistor 8 and consequently, the collector current. Since, however, the collector voltage of transistor 8 is initially established at an abnormally low value, the decrease in collector current will increase the collector voltage. Thus, the gain of transistor 8 will be increased rather than decreased as is the case for normal AGC action. Accordingly, the amount of signal translated and the AGC current will be further increased. This action is cumulative, the increasing AGC current increasing the gain of transistor 8 which will increase the AGC current from source 20. The cumulative action will cease when a predetermined emitter current and collector voltage are established in transistor 8 at which point the transistor 8 and the AGC perform in the normal manner as described above. Thus, in accordance with the present invention, a receiver may be squelched in the absence of a received signal or in the presence of a signal whose amplitude is less than a predetermined value. Accordingly, the reproduction of undesired noise is prevented in the absence of a received carrier wave signal or in the presence of low amplitude carrier wave signal.

Figure 2:
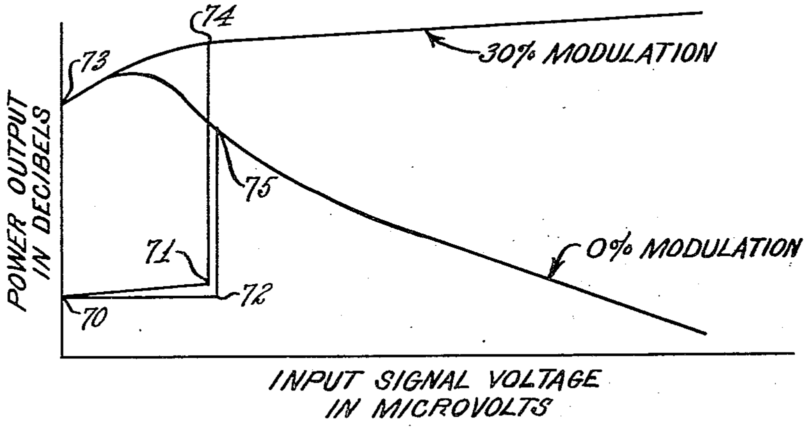
Figure 2 is a graph relating power output to input signal voltage for a radio receiver of the type illustrated in Figure 3.
Figure 3:
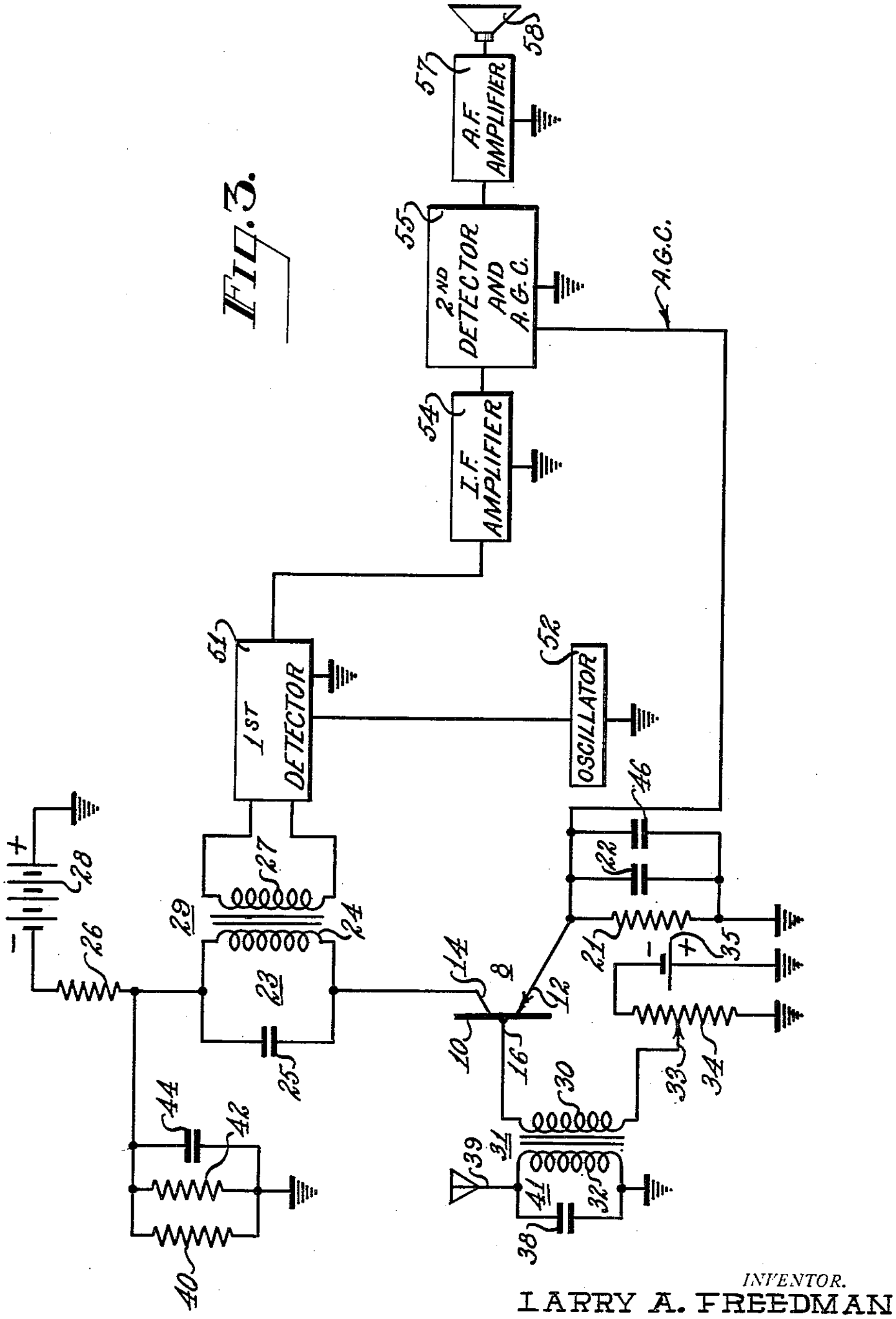
Figure 3 is a schematic circuit diagram of a superheterodyne signal receiver embodying a transistor amplifier and AGC source of the type illustrated in Figure 1 in accordance with the present invention.

In Figure 3, a superheterodyne receiver includes a radio frequency amplifying stage comprising the transistor 8 to which AGC currents are applied from an AGC current source 55. In Figure 2, input signal voltage of such a receiver has been plotted against the receiver's relative power output. As described hereinbefore, the squelch action maintains the output signal at a relatively low value which action has been indicated on the graph between the points 70 and 71, and 70 and 72, the points 71 and 72 representing a selected signal threshold value with thirty per cent and zero per cent modulation of the carrier wave, respectively. At this signal level the output signal increases rapidly as described above until normal emitter current and collector voltage are established. At the same time, normal amplification and AGC are established. The curve plotted between points 73 and 74, and 73 and 75 represents the input signal versus output power characteristic of the same receiver in which the collector voltage is initially established at a normal or relatively large value, for thirty per cent and zero per cent modulation, respectively. It is obvious, by comparing the curves as plotted, that by initially establishing the collector voltage at a low value, in accordance with the invention, effective squelch action is attained so that undesired output noise is eliminated for low signal input.

Fading of received signals which, in ordinary squelch circuit arrangements, may remove the received signal if reduced below the initial threshold is not encountered, since the AGC action prevents squelching until the signal fades to about one-tenth of this initial threshold. Squelching due to reduced signal input occurs only when the rate of decrease in gain due to reduced collector voltage is more rapid than the rate of increase in gain due to reduced AGC control. The value of one-tenth mentioned above is fairly typical but depends of course on the transistor collector characteristic and the gain of the AGC circuit.

The receiver illustrated in Figure 3 comprises, in general, an antenna 39 of any suitable type, a radio frequency signal transistor amplifier 8, a first detector 51, a local oscillator 52, an intermediate frequency signal amplifier 54, a second detector and AGC source 55, an audio frequency amplifier 57 and a loud speaker 58 or other suitable sound or reproducing or utilization means.

The frequency selective means for antenna 39 comprise a parallel resonant circuit 41 comprising a capacitor 38 and the primary winding 32 of a coupling transformer 31. One end of the secondary winding 30 of coupling transformer 31 is connected with the base 16 of radio frequency transistor amplifier 8 to couple incoming signals therewith, and the other end is connected through the tap 33 of the voltage dividing potentiometer 34 to the negative terminal of biasing battery 35, the positive terminal of which is grounded. The emitter 12 of transistor 8 is grounded through a resistor 21 which is by-passed by alternating current signals by two capacitors 22 and 46 in parallel, thus insuring a low impedance by-pass to ground for low as well as for high frequency alternating signals.

The radio frequency transistor amplifier 8 of the receiver illustrated in Figure 3 is, in general, identical with the transistor amplifier illustrated in Figure 1. In Figure 3, however, the collector circuit of transistor 8 includes a voltage dividing network comprising parallel resistors 40 and 42 and bypass capacitor 44 connected from the junction of collector resistor 26 and the low voltage end of parallel resonant circuit 23 to ground. In accordance with the present invention, squelch action is obtained by proportioning the resistance of resistor 40 and the voltage dividing network relative to the resistance of emitter biasing resistor 21 in such a manner that the collector voltage of transistor 8 will be low and substantially equal to zero for static operating conditions. In this manner, squelch action of the type already described in connection with Figure 1 is obtained. While the use of the voltage dividing network has been found, in some instances, to obtain a more positive squelch action, it should be understood that the choice of the particular collector resistance means used is primarily a design problem. All that is essential for the desired squelch action is that the resistance of the collector circuit be chosen relative to the resistance of the emitter resistor so that a low static collector voltage is obtained.

The output circuit for transistor 8 includes the frequency selective or parallel resonant circuit 23 which is connected with the collector 14 of transistor 8 and includes the capacitor 25 and inductor 24, which is the primary winding of the interstage couplying transformer 29. The secondary winding 27 of transformer 29 is connected to the receiver first detector 51 which may be of any suitable type. The local oscillator 52 is also connected with the detector 51.

The beat or intermediate frequency signal produced by the heterodyning of a local oscillator signal with a radio frequency signal in the first detector 51 is coupled to the intermediate frequency amplifying stage 54 of the receiver.

Amplified intermediate frequency signals are coupled to the transistor second detector 55 which may also be the source of AGC current. The detected audio frequency signals are coupled from the detector 55 to an audio frequency amplifier 57 of any suitable well known type, the output of which is connected to suitable utilization means such as loudspeaker 58. As thus described, the receiver illustrated in Figure 3 is seen to be of the well known superheterodyne type.

A superheterodyne radio receiver of the type illustrated in Figure 3 has been built and tested. While it will be understood that the circuit specifications may vary according to the design for any particular application, the following circuit specifications are included by way of example only:

| | | |
|---|---|---|
| Resistor 21 | ohms | 1000 |
| Resistor 26 | do | 2200 |
| Resistor 42 | do | 3300 |
| Battery 28 | volts | 6 |
| Battery 35 | do | 1.5 |

By choosing the resistance of resistor 40 to equal 3900 ohms, it was found that the receiver could be squelched for an input signal having an amplitude less than 15 microvolts when using the circuit specifications given above. By decreasing the resistance of resistor 40 to 2700 ohms using the same circuit specifications, squelch action was obtained until the voltage of the input signal reached 70 microvolts. Without the voltage dividing network shown in Figure 3, proper static operating conditions for the desired squelch action are obtainable by increasing the resistance of resistor 26 until the collector voltage is substantially equal to zero.

Figures 4, 6:
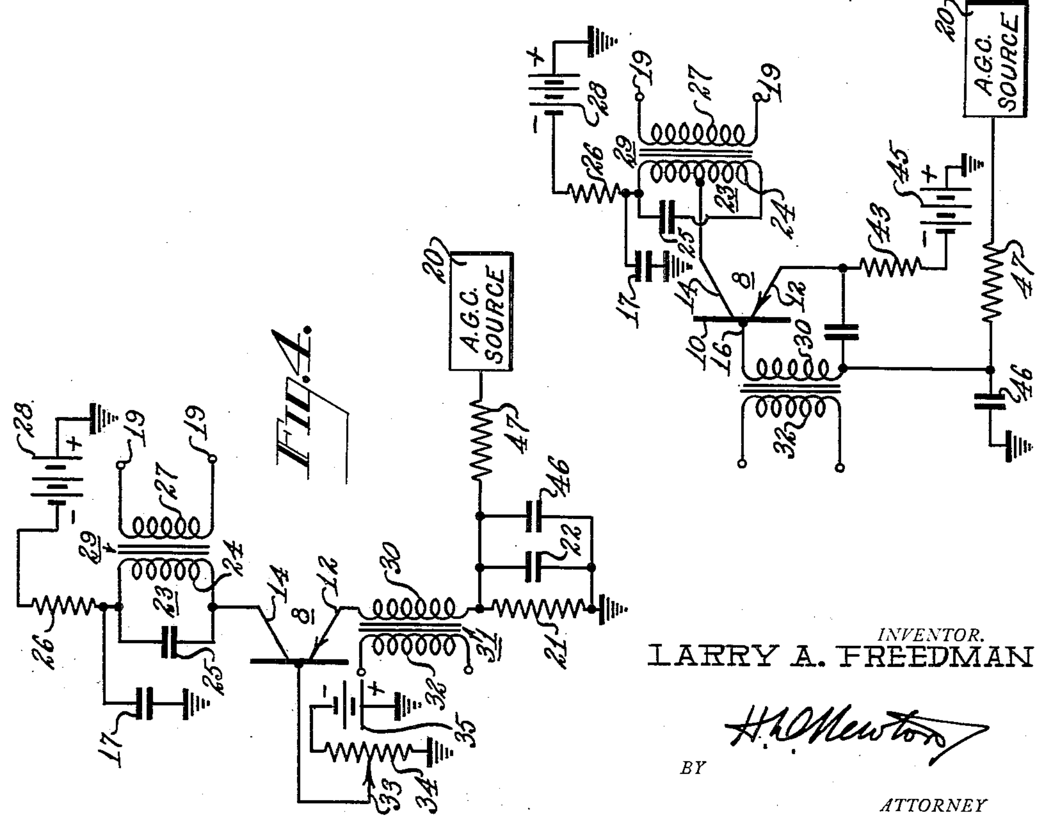

In Figure 4, a transistor amplifier 8 having a direct current AGC source 20 connected to its emitter 12 differs from the amplifier shown in Figure 1 only in that the incoming signal is applied to the emitter 12 of the device. To this end, the secondary winding 30 of input transformer 31 is connected between the emitter 12 and the emitter biasing resistor 21. In other respects, the circuit is identical with the one illustrated in Figure 1, emitter current control providing proper AGC action and the selection of the resistance of the collector resistor 26 so that the static collector voltage is low, providing squelch action in accordance with the invention.

Figure 5:
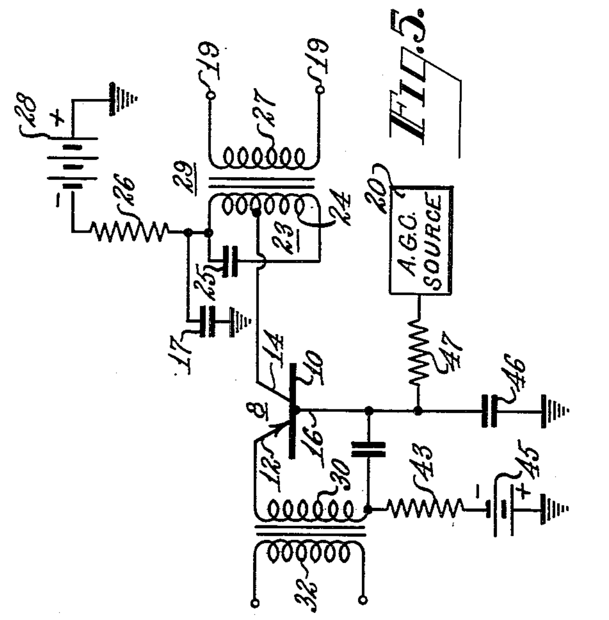
Figures 4, 5 and 6 are schematic circuit diagrams of transistor amplifiers and AGC sources showing various circuit modifications in accordance with the invention.

Squelch action, in accordance with the present invention, is not limited to signal receivers in which AGC action is obtained by controlling the emitter current of one or more transistor amplifiers. Thus, as shown in Figure 5, a transistor amplifier 8 may be connected for emitter input, and collector output, the AGC source 20 being connected through filtering means comprising a resistor 47 and a by-pass capacitor 46 to the base 16 of transistor 8. The collector circuit of transistor 8 is practically identical with the collector circuit illustrated in Figure 4, the difference being that the collector 14 is connected to a tap on the inductor 24. The emitter 12 of transistor

8 is connected through the secondary winding 30 of the input transformer 31 and resistor 43 to the negative terminal of a battery 45, the positive terminal of which is grounded. A source of input signals may then be connected to the primary winding 32 of transformer 31 and coupled through the secondary winding 30 to the emitter 12 of transistor 8.

For normal AGC and amplifier action as defined above, it is assumed that the AGC source 20 provides an increasing positive potential with increases in signal strength, thus making the base 16 of the transistor amplifier 8 more positive with increasing signal strength. This increase of the potential on the base 16 will reduce the forward bias between the emitter 12 and the base 16, or essentially reduce the gain of transistor 8. Squelch action, on the other hand, is obtained, in accordance with the present invention, by choosing the resistance of the collector circuit so that for static operating conditions the collector voltage is reduced to substantially zero, the exact value of collector voltage being determined by the desired signal threshold. Thus, the resistance of the collector resistor 26 may be so chosen to accomplish this result. By reducing the collector voltage, the gain of transistor 8 will also be reduced. Thus, there will be no or substantially no output signal when no signal is received or when the received signal is insufficiently strong for satisfactory reproduction.

When the received signal reaches a predetermined threshold value, however, the transistor amplifier 8 will be slightly conductive and cause the potential of the AGC source to become slightly more positive. This voltage will be applied to the base 16 of the transistor 8 causing it to go slightly positive. This will cause the collector current to decrease but since the collector voltage of transistor 8 is initially substantially equal to zero the decrease in collector current will increase the collector voltage. This will increase the gain of transistor 8 and the cumulative action described above will occur until a predetermined collector voltage is reached at which point the amplifying action of transistor 8 and the AGC perform in the normal manner. It is apparent, therefore, that squelch action in accordance with the invention may also be obtained with systems utilizing base voltage AGC.

In Figure 6, AGC control of transistor amplifier 8 is accomplished by connecting the AGC source 20 through filtering means comprising the resistor 47 and by-pass capacitor 46 and the secondary winding 30 of the input transformer 31 to the base 16 of transistor 8. A source of input signals may be connected with the primary winding 32 of transformer 30 and coupled through the secondary winding 30 to the base 16 of transistor 8. In other respects, the circuit is identical with the one illustrated in Figure 5, AGC action and squelching action being similarly obtained. It is apparent, therefore, that the present invention has practical application to a variety of different transistor amplifier circuits and for different types of AGC action.

As described herein, squelch action in a signal receiver employing semi-conductor devices is reliable and efficient and does not require the use of additional circuit elements. By choosing circuit parameters and biasing voltages as described, a squelch circuit for a transistorized signal receiver functions to render the receiver inoperative in the absence of a received signal and until the received signal reaches a predetermined threshold value. Thus the reproduction of undesired noise is prevented.

What is claimed is:

1. The combination with a semi-conductor signal amplifier device having base, emitter and collector electrodes, and having a signal input circuit connected between said base and emitter electrodes and a signal output circuit connected to said collector electrode, of means providing a bias voltage between said base and emitter electrodes in the forward direction, energizing means connected with said collector electrode, resistive means connected between said energizing means and said collector electrode to establish a substantially zero potential between said base and collector electrodes at static operating conditions, and direct current automatic gain control means connected with the input circuit and responsive to an increase in signal strength to decrease the bias voltage between said base and emitter electrodes on signals exceeding a predetermined value to increase the gain of said device as the amplitude of said applied signals begins to exceed said predetermined value and to thereafter decrease the gain of said device for further increases in the amplitude of said applied signal.

2. The combination as defined in claim 1, wherein said resistive means is a voltage dividing network.

3. The combination as defined in claim 1, wherein said automatic gain control means is coupled with said base electrode.

4. The combination as defined in claim 1, wherein said automatic gain control means is coupled with said emitter electrode.

5. In a radio signal receiver, the combination comprising, a signal amplifying semi-conductor device having an emitter, a collector, and a base electrode, conductive signal input means for applying carrier wave signal energy between said emitter and base electrodes, signal output means coupled with said collector electrode, means providing a bias voltage between said emitter and base electrodes in the forward direction, means providing a source of energizing voltage for said collector electrode, resistive means connected between said source of energizing voltage and said collector electrode and adapted to be traversed by the collector electrode current and provide a voltage drop thereacross for establishing a substantially zero bias between said collector and base electrodes in the absence of carrier wave signal energy, and direct current automatic gain control means connected with said signal input means and operative to decrease the collector electrode current to initially increase the gain of said device in response to a carrier wave signal of predetermined amplitude and to thereafter decrease the gain of said device for further increases in the amplitude of said carrier wave signal, thereby to provide noise squelching of said signal receiver.

6. A radio receiver as defined in claim 5 wherein said resistive means includes a voltage dividing network.

7. In a radio signal receiver, the combination comprising a signal amplifying semi-conductor device having an emitter electrode, a collector electrode and a base electrode, conductive means for connecting carrier wave signal energy with said base and emitter electrodes, frequency selective output means coupled with said collector electrode, means providing a bias voltage between said emitter and base electrodes in the forward direction, circuit means including a resistive impedance element and a source of direct current potential connected between said frequency selective means and a source of fixed reference potential, said resistive impedance element adapted to be traversed by the collector electrode current of said device for developing a D.-C. voltage thereacross to establish a substantially zero bias of said collector electrode with respect to said base electrode in the absence of said carrier wave signal energy, and signal responsive means for providing an automatic gain control current connected with said emitter electrode and operative to reduce the forward bias of said base to emitter circuit to reduce the collector current of said device and initially increase the gain of said device in response to a carrier wave signal of predetermined amplitude and to thereafter decrease the gain of said device proportional to increases in the amplitude of said carrier wave signal, thereby to provide noise squelching of said signal receiver.

References Cited in the file of this patent

UNITED STATES PATENTS

| | | |
|---|---|---|
| 1,869,331 | Ballantine | July 26, 1932 |
| 2,544,211 | Barton | Mar. 6, 1951 |
| 2,691,074 | Eberhard | Oct. 5, 1954 |

OTHER REFERENCES

Dixon article: Radio and Television News, February 1953, pages 35, 36, 37, 132.

Shea text: "Principles of Transistor Circuits," pages 472–473, pub. Sept. 15, 1953, by John Wiley & Sons Inc., New York.